United States Patent [19]
Petrovic

[11] Patent Number: 4,521,914
[45] Date of Patent: Jun. 4, 1985

[54] CIRCUIT ARRANGEMENT FOR INDICATING THE NAMES OF BROADCASTING STATIONS IN RADIO OR TV RECEIVERS

[76] Inventor: Branko Petrovic, Ebersteinweg 9, 1000 Berlin 37, Fed. Rep. of Germany

[21] Appl. No.: 403,629
[22] PCT Filed: Nov. 25, 1981
[86] PCT No.: PCT/DE81/00208
 § 371 Date: Jul. 19, 1982
 § 102(e) Date: Jul. 19, 1982
[87] PCT Pub. No.: WO82/01968
 PCT Pub. Date: Jun. 10, 1982

[30] Foreign Application Priority Data
 Nov. 26, 1980 [DE] Fed. Rep. of Germany ....... 3045037
 Jan. 29, 1981 [DE] Fed. Rep. of Germany ....... 3103377

[51] Int. Cl.³ ............................................. H04B 1/16
[52] U.S. Cl. .................................... 455/158; 455/186; 340/799
[58] Field of Search ....................... 455/158, 185, 186; 358/192.1; 340/756, 798, 799

[56] References Cited
U.S. PATENT DOCUMENTS
4,122,395 10/1978 Schotz et al. ..................... 455/158
4,228,541 10/1980 Snedkerud et al. ............... 455/158
4,314,375 2/1982 Belisomi ........................... 455/158

FOREIGN PATENT DOCUMENTS
2903944 8/1980 Fed. Rep. of Germany ...... 455/158
 3712 1/1978 Japan ................................. 455/158
149542 11/1980 Japan ................................. 455/158

Primary Examiner—Jin F. Ng
Attorney, Agent, or Firm—Basile, Weintraub & Hanlon

[57] ABSTRACT

A circuit arrangement for automatically indicating the alpha-numeric station designation of a received frequency signal in one of a plurality of frequency ranges in a radio or TV receiver. The circuit includes a counter for determining the frequency of the received signal. The counter addresses a first memory containing address information. A second memory connected to the first memory is addressed by the output of the first memory. The second memory stores information corresponding to the station designations of the received frequency signals. A third memory resets the counter to 0 to the lowest frequency within each range of receiving frequency signals.

8 Claims, 3 Drawing Figures

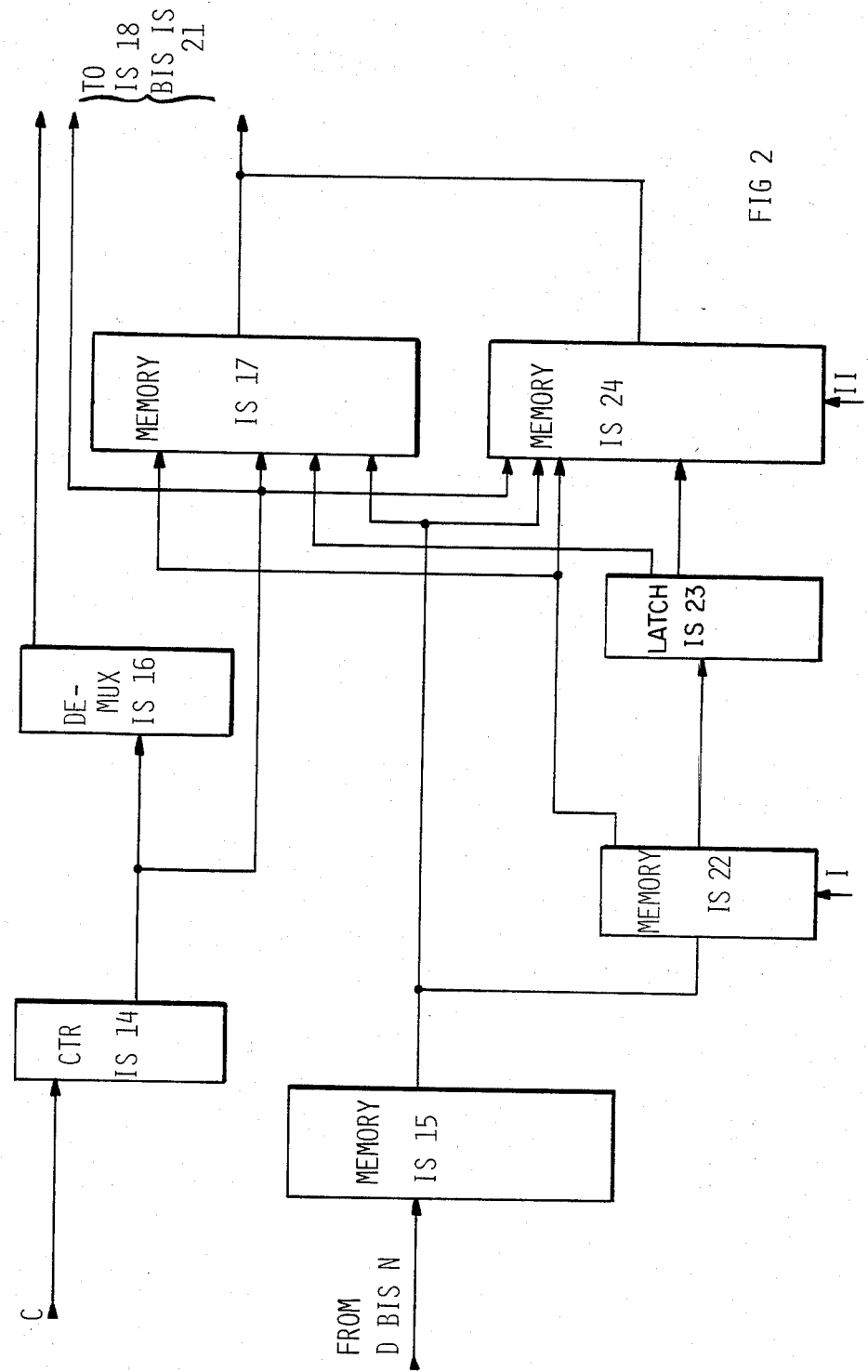

CIRCUIT ARRANGEMENT FOR INDICATING THE NAMES OF BROADCASTING STATIONS IN RADIO OR TV RECEIVERS

BACKGROUND OF THE INVENTION

1. Field of the Invention

The invention relates to a circuit arrangement for indicating the names of broadcasting stations in radio or TV receivers.

2. Description of the Prior Art

In order to tune the receiving oscillator in a radio device, the capacity of a condenser in the frequence determining oscillation range is changed. The condenser is coupled with a scale on which the frequences and/or the broadcasting stations are listed. However, the names of all receiving broadcasting stations cannot be entered on this scale. If only frequency values are listed on this scale, the name of the respective broadcasting stations must be determined by means of a broadcasting station table. The latter is also the case for digital tuning after frequency synthesis.

German Application No. 28 13 727 describes a circuit arrangement with a memory arrangement which contains information corresponding with the names of broadcasting stations with their carrier frequencies. A continuous comparison of all broadcasting frequencies with the currently set receiving frequency takes place. A drawback of this approach is that this comparison requires a certain time, particularly if there is a large number of broadcasting stations in the memory so that the indication cannot take place immediately as the respective frequency on the broadcasting station scale is passed. The described principle is applicable only if the number of broadcasting stations stored of the memory is in an order of magnitude which can be set directly by push buttons. Another drawback is that the complete frequency information for every station name to be stored must be retained in a memory.

SUMMARY OF THE INVENTION

The purpose of this invention is to provide a circuit arrangement for indicating station names in radio or TV receivers which may contain as many station names as desired without incurring a significant time loss in finding and indicating the set station. In particular, the memory expenditure required for retaining the station names should be kept at a lower level.

In accordance with this invention the required expenditure for the automatic station indication is greatly reduced by an addressing system derived from the receiving frequency (and/or the corresponding oscillator frequency) by division and/or addition and/or substraction. By addressing the broadcasting station memory—in the simplest case—directly by the divided set receiving frequency and/or the corresponding oscillator frequency, an automatic indication of the set stations is achieved in the simplest manner.

In an advantageous further development of the invention, the required memory for the broadcasting station names, addressed by data derived from the receiving frequency—compared with the current state of the art—is greatly reduced even if an additional memory is planned which correlates the received frequencies with the addresses in the memory containing the names of the stations.

Compared with known arrangements, it is not necessary to have a complete frequency value in the memory for every received station, but it is only necessary to have information which is sufficient for addressing the memory location containing the station designation. If multiple station or program designations exist, additional memory space can be saved by multiple addressing of the same designation.

Frequency tolerances, for example, can be equalized in an advantageous manner by identical addresses in the memory for the station names being contained in an additional memory for individual adjacent frequencies.

The memory for the station names can thus be structured essentially free of redundancy. Memories with storage locations of various sizes are planned in which in each case station names with the same or similar length are retained, and the names for the various programs of the broadcasting companies which are reflected by station chains must only exist once as "station names" and can be addressed by various frequencies implemented by the additional memory. This arrangement has the additional advantage that all radio programs which can be heard in a larger geographical area can be retained in the first memory, whereas the correlation of a station which can be heard in a certain region can be implemented by changing the contents of the additional (second) memory. This renders the memory capacity to be altered very much smaller so that locally different "exchange PROMs" can be produced with lower expenditure. An adjustment to local conditions can be achieved advantageously in such a manner that individual correlation stored in the ROM memories can be replaced by random correlations by additional selectively switchable RAM storage means.

In accordance with another additional development, receivers for several frequency ranges are equipped with additional converters which adjust the respective frequency ranges by frequency division and differentiation to the addressing range of the additional memory in such a manner that the resultant range of frequency values is superimposed over the available planned addressing range (beginning at the first memory location). The "resolution" determined by the number of planned memory addresses is adjusted to the frequency grid of the required tuning accuracy based on the respective frequency range.

The frequency grid resulting from the existing addresses is adjusted preferably to the density of station distributions determined by international agreements concerning wave schedules in such a manner that in each case another memory location for station names is addressed at the border line of a "receiving channel". This "synchronization" is achieved by the fact that the receiving frequency is divided in a ratio corresponding with the frequency grid of the wave schedule.

In order to also guarantee adjustment to local receiving conditions, the memories optionally containing the station names preferably together with the memories effecting the addressing can be produced in a plug-in form (i.e. a PROM memory) so that it is possible to facilitate equipment according to the requirements in the country of delivery and which furthermore enables the user to implement a corresponding change during trips upon moving and similar applications without particular difficulties. In order to facilitate changes by the user, it is advantageous to design the memories in the form of plug-in modules which can be handled without additional tools.

In another version of this invention an adjustment to local receiving conditions is achieved in particular by the fact that parallel to the programmed station names additional station names can be programmed in parallel RAM memories by external inputting means a (connectable key pad or similar means) which appear instead of the pre-programmed names if the corresponding frequency is set. In this manner differences can be established concerning the received stations at the receiving locations relative to the larger local area for which the receiver is intended. Instead of individual country names the address in the second memory which facilitates the correlation of receiving frequency and memory location for the broadcasting station name can be designed in a "superscribe" manner by a parallel RAM memory so that—particularly with station chains which broadcast a single program—the correlation of receiving frequency and program designation can be altered with little memory expenditure. The memory content to be altered per receiving program in this version of the invention corresponds with such information which is required in order to definitely identify a program designation within an existing "program table". This arrangement is helpful also in those cases where regional filler stations exist in addition to high-powered primary stations.

As indicated by the above, the invention can be used to advantage even in those cases where a station can be heard in nearly every receiving channel of the frequency grid determined by the wave schedule—preferably in the long, medium and short wave range so that addressing is free of redundancies caused by the additional second memory. The above described situation exists particularly with a dense frequency network as is increasingly the case particularly in densely populated regions. Due to the different expanding conditions, fewer stations can be heard in FM broadcasting networks as far as the respective receiving location is concerned, but this is offset by the number of channels per receiving area due to the broader band transmission so that the additional memory expenditure is low even if there is a possible address for all existing receiving frequencies. The latter problem can be reduced if specific memories are produced for certain receiving areas where frequency areas which are not covered do not require to be taken into consideration in the first as well as in the second memory. Since the coordinations on a preferred basis may be made differently for different frequency ranges combined in individual memory blocks, an optimum adjustment to all conditions is possible. The invention can be advantageously used for combined radio and TV receivers as well as for receivers prepared for the so-called "satellite TV".

BRIEF DESCRIPTION OF THE DRAWING

Below, the invention is explained by way of a version shown in the drawings. The drawings are identified as follows:

FIG. 2 shows an additional circuit for the version shown in FIG. 1.

DESCRIPTION OF THE PREFERRED EMBODIMENTS

Figure 1A:
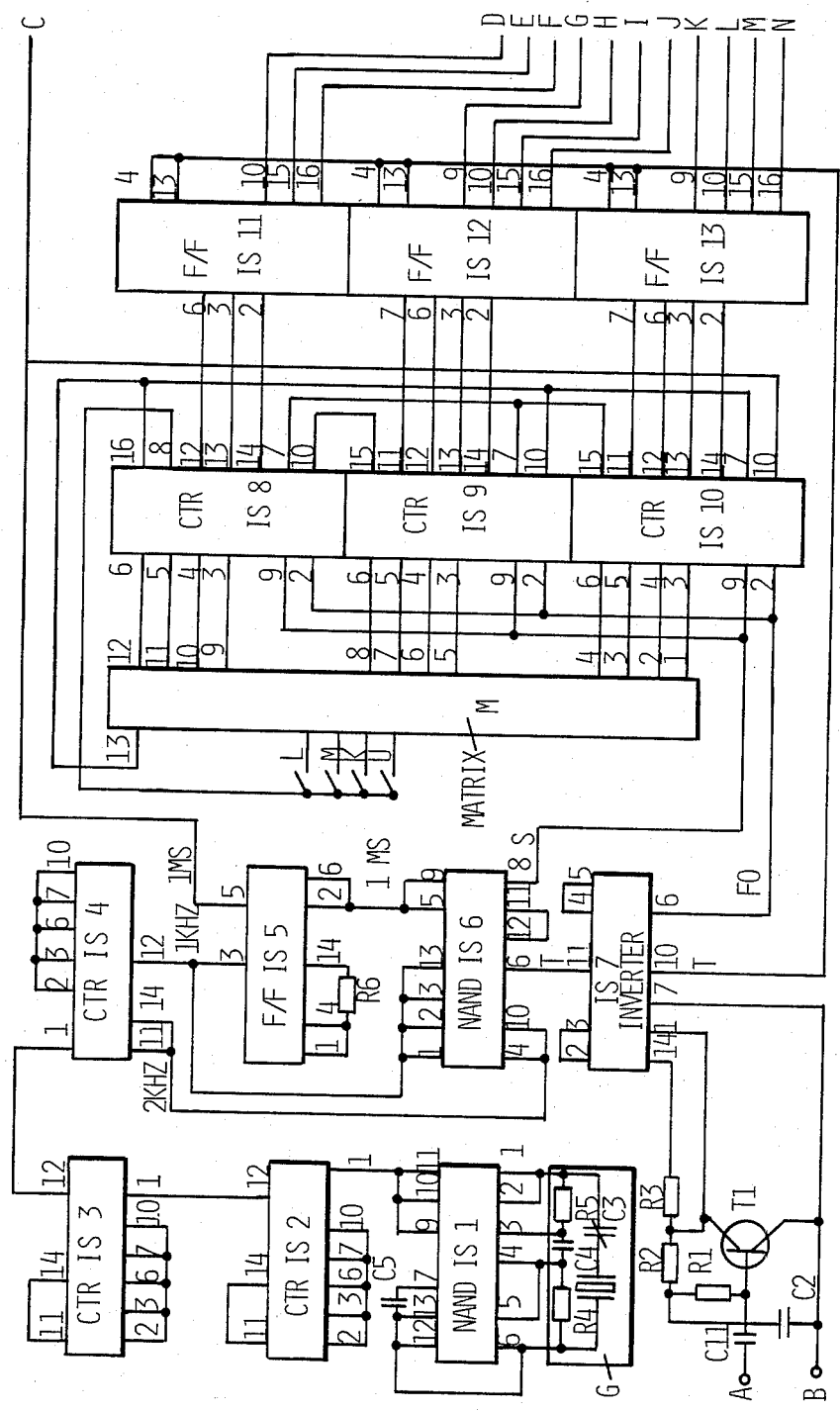
FIGS. 1a and 1b show a block circuit diagram of one version of the present invention.
Figure 1B:
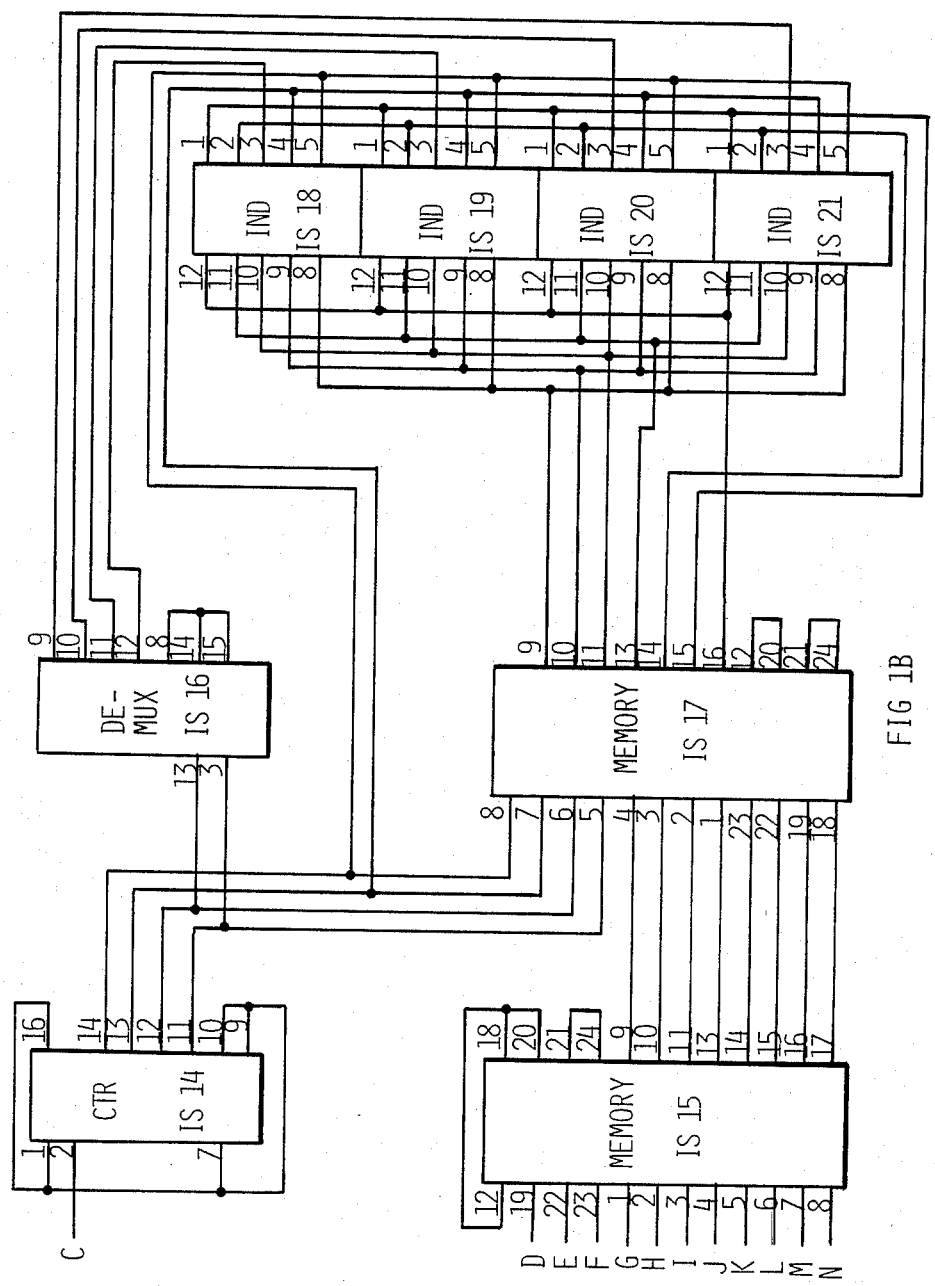

The version shown in FIGS. 1a and 1b comprises the following construction elements:
1. IS 1: SN7400 (4 NAND gates with 2 inputs)
2. IS 2: SN7490 (decimal counter)
3. IS 3: SN7490 (decimal counter)
4. IS 4: SN7490 (decimal counter)
5. IS 5: SN7474 (D-Flip-Flop)
6. IS 6: SN7410 (3 NAND gates with 3 inputs)
7. IS 7: SN7404 (six-fold inverter)
8. IS 8: SN74161 (synchronous 4-bit binary counter)
9. IS 9: SN74161 (synchronous 4-bit binary counter)
10. IS 10: SN74161 (synchronous 4-bit binary counter)
11. IS 11: SN7475 (D-Flip-Flop)
12. IS 12: SN7475 (D-Flip-Flop)
13. IS 13: SN7475 (D-Flip-Flop)
14. IS 14: SN74161 (synchronous 4-bit binary counter)
15. IS 15: HN462716 (2K-byte EPROM memory)
16. IS 16: SN74155 (2-bit demultiplexer)
17. IS 17: TMS2532 (4K-byte EPROM memory)
18. IS 18: DL1414 (4-digit 16-segment LED indicator with decoder)
19. IS 19: DL1414 (4-digit 16-segment LED indicator with decoder)
20. IS 20: DL1414 (4-digit 16-segment LED indicator with decoder)
21. IS 21: DL1414 (4-digit 16-segment LED indicator with decoder)
22. G: Oscillator, 1 MHz Oscillator G generates a frequency of 1 MHz, which is directed to the input of counter IS 2 (pin 1) via NAND gates IS 1. The counter divides the frequency in a ratio of 10:1. From the outlet of counter IS 2 (pin 12) the frequency continues to the input of counter IS 3 (pin 1) which also divides the frequency in a ratio of 10:1. From the output of IS 3 (pin 12) the frequency continues to the input of counter IS 4 (pin 1) which also reduces the frequency by 10:1. The entire dividing ratio thus is 1000:1. From the outlet of counter IS 4 (pin 12) the frequency advances to the input of the D-Flip-Flop IS 5 (pin 3). At the outputs of the D-Flip-Flop (pin 6, 2 and 5) pulses are created which have a pulse length of 1 ms. This pulse length is favorable since it enables the binary counters IS 8, 9, 10 to count the oscillator frequency of the receiver in Kilohertz. (By varying the counting time and/or the dividing ratio, an adjustment can be made to the frequency grid provided by the wave schedule.)

From the output of the integrated circuit IS 5 (pin 5) the pulses continue to the input of the binary counter IS 10 (pin 10). The counting time is determined by these pulses. The pulses also reach the input of counter IS 14 (pin 2).

From the output of the counter IS 4 (pin 11 with a frequency of 2 kHz and pin 12 with a frequency of 1 kHz) as well as from integrated circuit IS 5 (pin 6) the impulses are transported to the inputs of NAND gates IS 6 (pins 1, 4 and 5). At the outputs of integrated circuit IS 6, T-(Takt-) pulses are at pin 6 and S-(Stell-) pulses are produced at pin 8.

The T pulse at the output of integrated circuit IS 6 (pin 6) is conveyed to the inputs of flip-flops IS 11, 12, 13 (pin 4, 13) via an inverter IS 7 (pin 10). With this pulse the data from the binary counters IS 8, 9, 10 is transferred to the flip-flops IS 11, 12, 13.

The S pulse at the outlet of the NAND gate IS 6 (pin 8) is conveyed to the inlet of binary counters IS 8, 9, 10 (pin 9). With this impulse the data from a matrix M with which the presetting of counters IS 8, 9, 10 is determined is transferred to the binary counters IS 8, 9, 10 (pins 3, 4, 5, 6).

The oscillator frequency of the receiver is conveyed to terminals a, b and is conveyed to the Takt [pulse] inputs of binary counters IS 8, 9, 10 (pin 2) via a transistor T1 and an inverter IS 7 (pin 6).

The outputs of counters IS 8, 9, 10 (pin 11, 12, 13, 14) are connected with the inputs for flip-flops IS 11, 12, 13 (pins 2, 3, 6, 7) whereas the outputs of the flip-flops IS 11, 12, 13 (pins 9, 10, 15, 16) are connected to the addressing inputs of the 2K-byte ROM memory IS 15 (pins 1, 2, 3, 4, 5, 6, 7, 8, 19, 22, 23).

The outputs of memory IS 15 (pins 9, 10, 11, 13, 14, 15, 16, 17) lead to the addressing inputs of the 4K-byte ROM memory IS 17 (pins 4, 3, 2, 1, 23, 22, 19). The first four address inputs of memory IS 17 (pins 5, 6, 7, 8) are connected with the outputs of the binary counter IS 14 (pins 11, 12, 13, 14).

Connected to the outputs of memory IS 17 (pins 9, 10, 11, 13, 14, 15, 16) are the address inputs of indicators IS 18, 19, 20, 21 (pins 1, 2, 8, 9, 10, 11, 12).

The output pin 11 of the counter IS 14 leads to the input pin 3 of a demultiplexer IS 16, and correspondingly the output of pin 12 leads to the input of pin 13. The outputs of the demultiplexer IS 16 (pins 9, 10, 11, 12) are each connected with pin 3 of the indicators IS 18, 19, 20, 21. The outputs pins 13 and 14 of the counter IS 14 also lead to the inputs pins 4, 5 of the indicators IS 18, 19, 20, 21.

The mode of operation of this circuit arrangement is as follows:

Via terminals a and b, transistor T1 and the inverter IS 7 (pin 6), the oscillator frequency is led to the binary counters IS 8, 9, 10 which counts the frequency in Kilohertz.

For the FM range it is necessary to insert an attenuator of 20:1 between T1 and the inverter IS 7 in order to get a frequency step of 5 kHz between the stations. For television an attenuator of 1000:1 must be used between T1 and the integrated circuit IS 7 in order to obtain a frequency response of 7 and/or 8 kHz. These attenuators are not shown in the drawing.

When the output of the inverter IS 7 (pin 2, 6) supplies a high level pulse (a low level pulse is then at pin 5), control pulses T and S will then be generated at the outputs of the NAND gates IS 6 (pins 6 and 8).

Pulse T is generated only during the first half of the pulse at the input of the NAND gates IS 6 (pins 5, 9). This timing is determined via the pulses at the inputs of the NAND gates IS 6 (pin 1 and pin 4).

During the second half of the pulse at the input of the NAND gates IS 6 (pins 5, 9), an S-pulse is generated at the NAND gates IS 6 (pin 8).

By means of the sequence of T- and S-pulses, it is determined that the data will initially be taken from the binary counters IS 8, 9, 10 into the flip-flop IS 11, 12, 13 and subsequently the data will be taken over from the matrix M into the counters IS 8, 9, 10.

As long as pulses T and S are effective, counters IS 8, 9, 10 do not count since the counter IS 10 (pin 10) carries an low level pulse.

If a pulse with a high level is received at the flip-flop IS 5 (pin 5)—a pulse with a low level is incurred at pin 2, 6—each counter IS 8, 9, 10 counts the frequency which is incurred at its input point pin 2.

The binary number of the oscillator frequency of the receiver which is received at outlet pin 9, 10, 15, 16 of flip-flops IS 11, 12, 13 must be equal to zero for the lowest frequency in the wave range. By presetting counters IS 8, 9, 10, this condition is achieved through matrix M. The presetting which is implemented for every wave range is implemented in the following manner:

The frequency band in the long-wave, medium-wave and short-wave range runs from 150 kHz to 26 MHz. It was noted above that an attenuator 20:1 must be inserted between T1 and inverter IS 7 in the FM range. This means that a frequency band of 4.375 to 5.4 MHz appears at the outlet of the attenuator. This also means that the upper working frequency is 26 MHz.

In order to be able to count the frequency of 26 MHz, four binary 4-bit counters are required. The last output of the counter (32,768 kHz) is not needed since the upper working frequency is lower. Thus, the upper limit frequency of the counter is 32,767 kHz.

In order to guarantee that counters IS 8, 9, 10 output generate a binary zero at their outputs, the next condition must be met for the lowest frequency in the wave range:

$$f_v = f_{gz} - f_{uo},$$

wherein:

$f_v$—is the number of the frequency to which the counter must be preset.

$f_{gz}$—is the number of the upper limit frequency of the counter (32,767 kHz).

$f_{uo}$—is the number of the lowest oscillator frequency of the receiver in the wave range.

Under the assumption that the ZF (zero frequency) of the receiver is 455 kHz, the following is derived:

For the long-wave band $f_v = 32,767 - (150 + 455) = 32,162$ kHz.

The binary number 32,162 is formed by the outputs of the counter:

16,384; 8,192; 4,096; 2,048; 1,024; 256; 32; 2 (with a high level).

The following is valid for the AM range:

Memory IS 15 is also used for the AM band. For the first address in the AM range address 140 is available.

$$f_v = 32,767 + 140 - (520 + 455) \text{kHz} = 31,932 \text{ kHz}.$$

The binary number 31,932 forms the outputs of the counters: 16,384; 8,192; 4,096; 2,048; 1,024; 128; 32; 16; 8; 4.

The following holds true for the FM band:

Memory IS 15 is also scheduled for use for the FM band. The first address in the FM range is address 1,229.

$$f_v = 32,767 + 1,229 - (5,950 + 455) \text{kHz} = 27,591 \text{ kHZ}.$$

For memory IS 15 a 2K-byte ROM memory was selected (2,048×8 bit) which has 11 address inputs (A0 through A10). Memory IS 15 can be controlled with three binary 4-bit counters, although the calculation for presetting must be carried out with four binary 4-bit counters.

The outputs of the binary counters IS 8, 9, 10 (pins 11, 12, 13, 14) are connected with the address inputs of the 2K-byte ROM memory IS 15 (pins 1, 2, 3, 4, 5, 6, 7, 8, 19, 22, 23) via flip-flops IS 11, 12, 13 (pins 9, 10, 15, 16). The flip-flops IS 11, 12, 13 eliminate flickering of the letters at the indicators IS 18, 19, 20, 21.

Memory IS 15 has two purposes: it determines the address of memory IS 17 and eliminates the influence of the frequency variations of the receiver oscillator upon the accurate readouts of the indicator which is due to temperature changes or an inaccurate tuning of a station. The program of memory IS 15 is listed in the following table:

Addresses of memory IS 15 (at the output of IS 15):

| LONG-WAVE RANGE | | | | | | | | | | |
|---|---|---|---|---|---|---|---|---|---|---|
| 0 | 1 | 2 | 3 | 4 | 5 | 6 | 7 | 8 | 9 | 0 |
| 10 | 11 | 12 | 13 | 14 | 15 | 16 | 17 | 18 | | 1 |
| 19 | 20 | 21 | 22 | 23 | 24 | 25 | 26 | 27 | | 2 |
| 28 | 29 | 30 | 31 | 32 | 33 | 34 | 35 | 36 | | 3 |
| 37 | 38 | 39 | 40 | 41 | 42 | 43 | 44 | 45 | | 4 |
| 46 | 47 | 48 | 49 | 50 | 51 | 52 | 53 | 54 | | 5 |
| 55 | 56 | 57 | 58 | 59 | 60 | 61 | 62 | 63 | | 6 |
| 64 | 65 | 66 | 67 | 68 | 69 | 70 | 71 | 72 | | 7 |
| 73 | 74 | 75 | 76 | 77 | 78 | 79 | 80 | 81 | | 8 |
| 82 | 83 | 84 | 85 | 86 | 87 | 88 | 89 | 90 | | 9 |
| 91 | 92 | 93 | 94 | 95 | 96 | 97 | 98 | 99 | | 10 |
| 100 | 101 | 102 | 103 | 104 | 105 | 106 | 107 | 108 | | 11 |
| 109 | 110 | 111 | 112 | 113 | 114 | 115 | 116 | 117 | | 12 |
| 118 | 119 | 120 | 121 | 122 | 123 | 124 | 125 | 126 | | 13 |
| 127 | 128 | 129 | 130 | 131 | 132 | 133 | 134 | 135 | | 14 |

| AM RANGE | | | | | | | | | | |
|---|---|---|---|---|---|---|---|---|---|---|
| 136 | 137 | 138 | 139 | 140 | 141 | 142 | 143 | 144 | 145 | 15 |
| 146 | 147 | 148 | 149 | 150 | 151 | 152 | 153 | 154 | 155 | 16 |
| 156 | 157 | 158 | 159 | 160 | 161 | 162 | 163 | 164 | | 17 |
| 165 | 166 | 167 | 168 | 169 | 170 | 171 | 172 | 173 | | 18 |
| 174 | 175 | 176 | 177 | 178 | 179 | 180 | 181 | 182 | | 19 |
| 183 | 184 | 185 | 186 | 187 | 188 | 189 | 190 | 191 | | 20 |
| 192 | 193 | 194 | 195 | 196 | 197 | 198 | 199 | 200 | | 21 |
| 201 | 202 | 203 | 204 | 205 | 206 | 207 | 208 | 209 | | 22 |
| 210 | 211 | 212 | 213 | 214 | 215 | 216 | 217 | 218 | | 23 |
| 219 | 220 | 221 | 222 | 223 | 224 | 225 | 226 | 227 | | 24 |
| 228 | 229 | 230 | 231 | 232 | 233 | 234 | 235 | 236 | | 25 |
| 237 | 238 | 239 | 240 | 241 | 242 | 243 | 244 | 245 | | 26 |
| 246 | 247 | 248 | 249 | 250 | 251 | 252 | 253 | 254 | | 27 |
| 255 | 256 | 257 | 258 | 259 | 260 | 261 | 262 | 263 | | 28 |
| 264 | 265 | 266 | 267 | 268 | 269 | 270 | 271 | 272 | | 29 |
| 273 | 274 | 275 | 276 | 277 | 278 | 279 | 280 | 281 | | 30 |
| 282 | 283 | 284 | 285 | 286 | 287 | 288 | 289 | 290 | | 31 |
| 291 | 292 | 293 | 294 | 295 | 296 | 297 | 298 | 299 | | 32 |
| 300 | 301 | 302 | 303 | 304 | 305 | 306 | 307 | 308 | | 33 |
| 309 | 310 | 311 | 312 | 313 | 314 | 315 | 316 | 317 | | 34 |
| 318 | 319 | 320 | 321 | 322 | 323 | 324 | 325 | 326 | | 35 |
| 327 | 328 | 329 | 330 | 331 | 332 | 333 | 334 | 335 | | 36 |
| 336 | 337 | 338 | 339 | 340 | 341 | 342 | 343 | 344 | | 37 |
| 345 | 346 | 347 | 348 | 349 | 350 | 351 | 352 | 353 | | 38 |
| 354 | 355 | 356 | 357 | 358 | 359 | 360 | 361 | 362 | | 39 |
| 363 | 364 | 365 | 366 | 367 | 368 | 369 | 370 | 371 | | 40 |
| 372 | 373 | 374 | 375 | 376 | 377 | 378 | 379 | 380 | | 41 |
| 381 | 382 | 383 | 384 | 385 | 386 | 387 | 388 | 389 | | 42 |
| 390 | 391 | 392 | 393 | 394 | 395 | 396 | 397 | 398 | | 43 |
| 399 | 400 | 401 | 402 | 403 | 404 | 405 | 406 | 407 | | 44 |
| 408 | 409 | 410 | 411 | 412 | 413 | 414 | 415 | 416 | | 45 |
| 417 | 418 | 419 | 420 | 421 | 422 | 423 | 424 | 425 | | 46 |
| 426 | 427 | 428 | 429 | 430 | 431 | 432 | 433 | 434 | | 47 |
| 435 | 436 | 437 | 438 | 439 | 440 | 441 | 442 | 443 | | 48 |
| 444 | 445 | 446 | 447 | 448 | 449 | 450 | 451 | 452 | | 49 |
| 453 | 454 | 455 | 456 | 457 | 458 | 459 | 460 | 461 | | 50 |
| 462 | 463 | 464 | 465 | 466 | 467 | 468 | 469 | 470 | | 51 |
| 471 | 472 | 473 | 474 | 475 | 476 | 477 | 478 | 479 | | 52 |
| 480 | 481 | 482 | 483 | 484 | 485 | 486 | 487 | 488 | | 53 |
| 489 | 490 | 491 | 492 | 493 | 494 | 495 | 496 | 497 | | 54 |
| 498 | 499 | 500 | 501 | 502 | 503 | 504 | 505 | 506 | | 55 |
| 507 | 508 | 509 | 510 | 511 | 512 | 513 | 514 | 515 | | 56 |
| 516 | 517 | 518 | 519 | 520 | 521 | 522 | 523 | 524 | | 57 |
| 525 | 526 | 527 | 528 | 529 | 530 | 531 | 532 | 533 | | 58 |
| 534 | 535 | 536 | 537 | 538 | 539 | 540 | 541 | 542 | | 59 |
| 543 | 544 | 545 | 546 | 547 | 548 | 549 | 550 | 551 | | 60 |
| 552 | 553 | 554 | 555 | 556 | 557 | 558 | 559 | 560 | | 61 |
| 561 | 562 | 563 | 564 | 565 | 566 | 567 | 568 | 569 | | 62 |
| 570 | 571 | 572 | 573 | 574 | 575 | 576 | 577 | 578 | | 63 |
| 579 | 580 | 581 | 582 | 583 | 584 | 585 | 586 | 587 | | 64 |
| 588 | 589 | 590 | 591 | 592 | 593 | 594 | 595 | 596 | | 65 |
| 597 | 598 | 599 | 600 | 601 | 602 | 603 | 604 | 605 | | 66 |
| 606 | 607 | 608 | 609 | 610 | 611 | 612 | 613 | 614 | | 67 |
| 615 | 616 | 617 | 618 | 619 | 620 | 621 | 622 | 623 | | 68 |
| 624 | 625 | 626 | 627 | 628 | 629 | 630 | 631 | 632 | | 69 |
| 633 | 634 | 635 | 636 | 637 | 638 | 639 | 640 | 641 | | 70 |
| 642 | 643 | 644 | 645 | 646 | 647 | 648 | 649 | 650 | | 71 |
| 651 | 652 | 653 | 654 | 655 | 656 | 657 | 658 | 659 | | 72 |
| 660 | 661 | 662 | 663 | 664 | 665 | 666 | 667 | 668 | | 73 |
| 669 | 670 | 671 | 672 | 673 | 674 | 675 | 676 | 677 | | 74 |
| 678 | 679 | 680 | 681 | 682 | 683 | 684 | 685 | 686 | | 75 |
| 687 | 688 | 689 | 690 | 691 | 692 | 693 | 694 | 695 | | 76 |
| 696 | 697 | 698 | 699 | 700 | 701 | 702 | 703 | 704 | | 77 |
| 705 | 706 | 707 | 708 | 709 | 710 | 711 | 712 | 713 | | 78 |
| 714 | 715 | 716 | 717 | 718 | 719 | 720 | 721 | 722 | | 79 |
| 723 | 724 | 725 | 726 | 727 | 728 | 729 | 730 | 731 | | 80 |
| 732 | 733 | 734 | 735 | 736 | 737 | 738 | 739 | 740 | | 81 |
| 741 | 742 | 743 | 744 | 745 | 746 | 747 | 748 | 749 | | 82 |
| 750 | 751 | 752 | 753 | 754 | 755 | 756 | 757 | 758 | | 83 |
| 759 | 760 | 761 | 762 | 763 | 764 | 765 | 766 | 767 | | 84 |
| 768 | 769 | 770 | 771 | 772 | 773 | 774 | 775 | 776 | | 85 |
| 777 | 778 | 779 | 780 | 781 | 782 | 783 | 784 | 785 | | 86 |
| 786 | 787 | 788 | 789 | 790 | 791 | 792 | 793 | 794 | | 87 |
| 795 | 796 | 797 | 798 | 799 | 800 | 801 | 802 | 803 | | 88 |
| 804 | 805 | 806 | 807 | 808 | 809 | 810 | 811 | 812 | | 89 |
| 813 | 814 | 815 | 816 | 817 | 818 | 819 | 820 | 821 | | 90 |
| 822 | 823 | 824 | 825 | 826 | 827 | 828 | 829 | 830 | | 91 |
| 831 | 832 | 833 | 834 | 835 | 836 | 837 | 838 | 839 | | 92 |
| 840 | 841 | 842 | 843 | 844 | 845 | 846 | 847 | 848 | | 93 |
| 849 | 850 | 851 | 852 | 853 | 854 | 855 | 856 | 857 | | 94 |
| 858 | 859 | 860 | 861 | 862 | 863 | 864 | 865 | 866 | | 95 |
| 867 | 868 | 869 | 870 | 871 | 872 | 873 | 874 | 875 | | 96 |
| 876 | 877 | 878 | 879 | 880 | 881 | 882 | 883 | 884 | | 97 |
| 885 | 886 | 887 | 888 | 889 | 890 | 891 | 892 | 893 | | 98 |
| 894 | 895 | 896 | 897 | 898 | 899 | 900 | 901 | 902 | | 99 |
| 903 | 904 | 905 | 906 | 907 | 908 | 909 | 910 | 911 | | 100 |
| 912 | 913 | 914 | 915 | 916 | 917 | 918 | 919 | 920 | | 101 |
| 921 | 922 | 923 | 924 | 925 | 926 | 927 | 928 | 929 | | 102 |
| 930 | 931 | 932 | 933 | 934 | 935 | 936 | 937 | 938 | | 103 |
| 939 | 940 | 941 | 942 | 943 | 944 | 945 | 946 | 947 | | 104 |
| 948 | 949 | 950 | 951 | 952 | 953 | 954 | 955 | 956 | | 105 |
| 957 | 958 | 959 | 960 | 961 | 962 | 963 | 964 | 965 | | 106 |
| 966 | 967 | 968 | 969 | 970 | 971 | 972 | 973 | 974 | | 107 |
| 975 | 976 | 977 | 978 | 979 | 980 | 981 | 982 | 983 | | 108 |
| 984 | 985 | 986 | 987 | 988 | 989 | 990 | 991 | 992 | | 109 |
| 993 | 994 | 995 | 996 | 997 | 998 | 999 | 1000 | 1001 | | 110 |
| 1002 | 1003 | 1004 | 1005 | 1006 | 1007 | 1008 | 1009 | 1010 | | 111 |
| 1011 | 1012 | 1013 | 1014 | 1015 | 1016 | 1017 | 1018 | 1019 | | 112 |
| 1020 | 1021 | 1022 | 1023 | 1024 | 1025 | 1026 | 1027 | 1028 | | 113 |
| 1029 | 1030 | 1031 | 1032 | 1033 | 1034 | 1035 | 1036 | 1037 | | 114 |
| 1038 | 1039 | 1040 | 1041 | 1042 | 1043 | 1044 | 1045 | 1046 | | 115 |
| 1047 | 1048 | 1049 | 1050 | 1051 | 1052 | 1053 | 1054 | 1055 | | 116 |
| 1056 | 1057 | 1058 | 1059 | 1060 | 1061 | 1062 | 1063 | 1064 | | 117 |
| 1065 | 1066 | 1067 | 1068 | 1069 | 1070 | 1071 | 1072 | 1073 | | 118 |
| 1074 | 1075 | 1076 | 1077 | 1078 | 1079 | 1080 | 1081 | 1082 | | 119 |
| 1083 | 1084 | 1085 | 1086 | 1087 | 1088 | 1089 | 1090 | 1091 | | 120 |
| 1092 | 1093 | 1094 | 1095 | 1096 | 1097 | 1098 | 1099 | 1100 | | 121 |
| 1101 | 1102 | 1103 | 1104 | 1105 | 1106 | 1107 | 1108 | 1109 | | 122 |
| 1110 | 1111 | 1112 | 1113 | 1114 | 1115 | 1116 | 1117 | 1118 | | 123 |
| 1119 | 1120 | 1121 | 1122 | 1123 | 1124 | 1125 | 1126 | 1127 | | 124 |
| 1128 | 1129 | 1130 | 1131 | 1132 | 1133 | 1134 | 1135 | 1136 | | 125 |
| 1137 | 1138 | 1139 | 1140 | 1141 | 1142 | 1143 | 1144 | 1145 | | 126 |
| 1146 | 1147 | 1148 | 1149 | 1150 | 1151 | 1152 | 1153 | 1154 | | 127 |
| 1155 | 1156 | 1157 | 1158 | 1159 | 1160 | 1161 | 1162 | 1163 | | 128 |
| 1164 | 1165 | 1166 | 1167 | 1168 | 1169 | 1170 | 1171 | 1172 | | 129 |
| 1173 | 1174 | 1175 | 1176 | 1177 | 1178 | 1179 | 1180 | 1181 | | 130 |
| 1182 | 1183 | 1184 | 1185 | 1186 | 1187 | 1188 | 1189 | 1190 | | 131 |
| 1191 | 1192 | 1193 | 1194 | 1195 | 1196 | 1197 | 1198 | 1199 | | 132 |
| 1200 | 1201 | 1202 | 1203 | 1204 | 1205 | 1206 | 1207 | 1208 | | 133 |
| 1209 | 1210 | 1211 | 1212 | 1213 | 1214 | 1215 | 1216 | 1217 | | 134 |
| 1218 | 1219 | 1220 | 1221 | 1222 | 1223 | 1224 | 1225 | 1226 | | 135 |

| FM RANGE | | | | | |
|---|---|---|---|---|---|
| 1227 | 1228 | 1229 | 1230 | 1231 | 136 |
| 1232 | 1233 | 1234 | 1235 | 1236 | 137 |

The program for memory IS 15 is listed for long-wave and AM ranges. It is valid correspondingly for the short-wave and FM range.

By way of the program of memory IS 15, the outputs have been determined which must show the same binary numbers for certain address groups.

In detail the two purposes for memory IS 15 are as follows:

1. The influence of changes of the oscillator frequency of the receiver upon the accurate readout of the indicators IS 18, 19, 20, 21 is to be eliminated. This is facilitated by using the free addresses in memory IS 15.

The broadcasting station "Deutschlandfunk" [Radio Germany] in the long-wave range broadcasts at 155 kHz. The lowest frequency in this range is 150 kHz. By way of the presetting it was achieved that the binary counters IS 8, 9, 10 show a binary zero for the lowest frequency at their outputs pins 11, 12, 13, 14. For the broadcasting frequency of 155 kHz counters IS 8, 9, 10 should show a binary 5 at their output. The next broadcasting station "Radio France" broadcasts at 164 kHz. At this frequency the counters IS 8, 9, 10 should output a binary 14. These figures 5 and 14 are simultaneously the address numbers of memory IS 15. Between these two addresses, addresses 6, 7, 8, 9, 10, 11, 12 and 13 remain free.

When the frequency of the oscillator of the receiver is lower 1 kHz, the following is valid: counters IS 8, 9, 10 at the broadcasting station "Radio France" now show a binary 13. Using the program of memory IS 15, it was achieved that the output of memory IS 15 contains the same number for address 13 as for address 14. In this manner it was achieved that the indicators IS 18, 19, 20, 21 can still show the same station name with frequency discrepancies of ±4 kHz.

2. Memory IS 15 determines the address of memory IS 17 in which are stored the names of the broadcasting stations.

The station names consist of several letters. Memory IS 7 was programmed in such a manner that 16 positions are available for every name. The name of the first station is located at addresses 0 through 15. Addresses 16 through 31 are scheduled for the second station and so forth.

The programming of memory IS 17 is listed in the following table:

| Running No. | Addresses | Name | Country |
|---|---|---|---|
| | | LONG-WAVE BAND | |
| 1. | 15–0 | Radio Germany | — |
| 2. | 31–16 | Radio France | France |
| 3. | 47–32 | Moscow | USSR |
| 4. | 63–48 | Voice of the GDR | German Democratic Republic (GDR) |
| 5. | 79–64 | Motala | Sweden |
| 6. | 95–80 | Warsaw | Poland |
| 7. | 111–95 | Radio Germany | — |
| 8. | 127–112 | Monte Carlo | Monaco |
| 9. | 143–128 | Warsaw | Poland |
| 10. | 159–144 | Luxembourg | Luxembourg |
| 11. | 175–160 | Kalundborg | Denmark |
| 12. | 191–176 | Lahti | Finland |
| 13. | 207–192 | Moscow | USSR |
| 14. | 223–208 | Prague | Czechoslovakia |
| 15. | 239–224 | Minsk | USSR |
| | | AM RANGE | |
| 16. | 255–240 | Innsbruck | Austria |
| 17. | 271–256 | Leipzig | GDR |
| 18. | 287–273 | Budapest | Hungary |
| 19. | 303–288 | Radio Germany | — |
| 20. | 319–304 | Neubrandenburg | |
| 21. | 335–320 | Berlin West | |
| 22. | 351–336 | Schwerin | GDR |

-continued

| Running No. | Addresses | Name | Country |
|---|---|---|---|
| 23. | 367–352 | Vienna | Austria |
| 24. | 383–368 | Frankfurt | Germany |
| 25. | 399–384 | Potsdam | GDR |
| 26. | 415–400 | Sarajevo | Yugoslavia |
| 27. | 431–416 | Brussel | Belgium |
| 28. | 447–432 | Berlin West | |
| 29. | 463–448 | Prague | Czechoslovakia |
| 30. | 479–464 | London | Great Britain |
| 31. | 495–480 | Berlin East | GDR |
| 32. | 511–496 | Southwest Radio | Germany |
| 33. | 527–496 | Marseille | France |
| 34. | 543–528 | Beograd-Berlin | |
| 35. | 559–544 | Berlin East | GDR |
| 36. | 575–560 | Andorra | |
| 37. | 591–576 | Rennes | France |
| 38. | 607–592 | Langenberg | Germany |
| 39. | 623–608 | Putbus | GDR |
| 40. | 639–624 | Warsaw | Poland |
| 41. | 655–640 | Lopik | Netherlands |
| 42. | 671–656 | Radio Germany | — |
| 43. | 687–672 | Sottens | Sweden |
| 44. | 703–688 | Stockholm | Sweden |
| 45. | 719–794 | Burg | GDR |
| 46. | 735–720 | Limoges | France |
| 47. | 751–736 | Munich | Germany |
| 48. | 767–752 | Skopye | Yugoslavia |
| 49. | 783–768 | Warsaw | Poland |
| 50. | 799–784 | Hanover | Germany |
| 51. | 815–800 | Nancy | France |
| 52. | 831–816 | Rome | Italy |
| 53. | 847–832 | Berlin West | |
| 54. | 863–848 | Paris | France |
| 55. | 879–864 | Frankfurt | Germany |
| 56. | 895–880 | Wachenbrunn | GDR |
| 57. | 911–896 | Antalya | Turkey |
| 58. | 927–912 | Milan | Italy |
| 59. | 943–928 | Nurenburg | Germany |
| 60. | 959–944 | Ljubljana | Yugoslavia |
| 61. | 975–960 | Wolvertem | Belgium |
| 62. | 991–976 | Bremen | Germany |
| 63. | 1007–992 | Toulouse | France |
| 64. | 1023–1008 | Brunn | Czechoslovakia |
| 65. | 1039–1024 | Nikosia | Cypress |
| 66. | 1055–1040 | Hamburg | Germany |
| 67. | 1071–1056 | Goteborg | Sweden |
| 68. | 1087–1072 | Berlin West | |
| 69. | 1103–1088 | Schwerin | GDR |
| 70. | 1119–1104 | Lopik | Netherlands |
| 71. | 1135–1120 | Wolfsheim | Germany |
| 72. | 1151–1136 | Linz | Austria |
| 73. | 1167–1152 | Lisbon | Portugal |
| 74. | 1183–1168 | Dresden | GDR |
| 75. | 1199–1184 | Iasi | Romania |
| 76. | 1215–1200 | Kalundborg | Denmark |
| 77. | 1231–1216 | Lille | France |
| 78. | 1247–1232 | Katowitze | Poland |
| 79. | 1263–1248 | Tirana | Albania |
| 80 | 1279–1264 | Pressburg | Czechoslovakia |
| 81. | 1295–1280 | Berlin AFN | |
| 82. | 1311–1296 | Bari | Italy |
| 83. | 1327–1312 | Stara Zagora | Bulgaria |
| 84. | 1343–1328 | Zagreb | Yugoslavia |
| 85. | 1359–1344 | AFN | |
| 86. | 1375–1360 | Cluj | Romania |
| 87. | 1391–1376 | Strassburg | France |
| 88. | 1407–1392 | Plauen | GDR |
| 89. | 1423–1408 | Stockholm | Sweden |
| 90. | 1439–1424 | Szolnok | Hungary |
| 91. | 1455–1440 | Munich | Germany |
| 92. | 1471–1456 | Wroclaw | Poland |
| 93. | 1487–1472 | Tiran | Albania |
| 94. | 1503–1488 | Sofija | Bulgaria |
| 95. | 1519–1504 | Prague | Czechoslovakia |
| 96. | 1535–1520 | Kiev | USSR |
| 97. | 1551–1536 | Tripolis | Libia |
| 98. | 1567–1552 | Warsaw | Poland |
| 99. | 1583–1568 | Radio Germany | — |
| 100. | 1599–1584 | Strassburg | France |
| 101. | 1615–1600 | Prague | Czechoslovakia |
| 102. | 1631–1616 | London | Great Britain |

-continued

| Running No. | Addresses | Name | Country |
|---|---|---|---|
| 103. | 1647–1632 | Warsaw | Poland |
| 104. | 1663–1648 | Stavanger | Norway |
| 105. | 1679–1664 | Nauen | GDR |
| 106. | 1695–1680 | Rome | Italy |
| 107. | 1711–1696 | Lisnagarvey | Great Britain |
| 108. | 1727–1712 | Nica | France |
| 109. | 1743–1728 | Berlin East | GDR |
| 110. | 1759–1744 | Krakow | USSR |
| 111. | 1775–1760 | Lille | France |
| 112. | 1791–1776 | Kaunas | USSR |
| 113. | 1807–1792 | Lushnye | Albania |
| 114. | 1823–1808 | Ajaccio | France |
| 115. | 1839–1824 | Pristina | Yugoslavia |
| 116. | 1855–1840 | Saarbruecken | Germany |
| 117. | 1871–1856 | Bernburg | GDR |
| 118. | 1887–1872 | Luxembourg | Luxembourg |
| 119. | 1903–1888 | Berlin West | |
| 120. | 1919–1904 | Tirana | Albania |
| 121. | 1935–1920 | Monte Carlo | Monaco |
| 122. | 1951–1936 | Vienna | Austria |
| 123. | 1967–1952 | AFN | |
| 124. | 1983–1968 | Leningrad | USSR |
| 125. | 1999–1984 | Stargrad | Poland |
| 126. | 2015–2000 | Antwerpen | Belgium |
| 127. | 2031–2016 | Kosice | Czechoslovakia |
| 128. | 2047–2032 | Vatikan | Vatikan |
| 129. | 2063–2048 | Radio Germany | — |
| 130. | 2079–2064 | Vinnitza | USSR |
| 131. | 2095–2080 | Nizza | France |
| 132. | 2111–2096 | Sfax | Tunisia |
| 133. | 2127–2112 | Weida | GDR |
| 134. | 2143–2128 | Klagenfurt | Austria |
| 135. | 2159–2144 | Langenberg | Germany |
| 136. | 2175–2160 | Potsdam | GDR |
| SHORT-WAVE RANGE | | | |
| 137. | 2192–2176 | ... | ... |

Together with a program for memory IS 17, the station names and the abbreviation for the country in which the station is located were inputted into memory IS 17.

The letters of the station name were listed in reverse sequence since indicators IS 18, 19, 20, 21 show the letters in reverse order as will be illustrated by way of an example:

| Addresses: | 15-14-13-12-11-10--9--8--7--6--5--4--3--2--1--0 |
|---|---|
| Name: | DEUTSCHLANDFUNK |
| | (Radio Germany) |

Described below is the control of the memory IS 17 and the indicators IS 18, 19, 20, 21 by way of the binary counter IS 14 and the demultiplexer IS 16.

In order to be able to indicate these 16 positions for every name of a station, the first four addresses of memory IS 17 (pins 8, 7, 6, 5) are connected with the outputs of counter IS 14 (pins 14, 13, 12, 11). The outputs of memory IS 15 are connected with the address inputs of memory IS 17 as follows: output pin 9(Do) with the input pin 4(a4), output pin 10(d1) with input pin 3(a5), and so forth.

Binary counter IS 14 and the 2-bit demultiplexer IS 16 control the multiplex operation of memory IS 17 and the indicators IS 18, 19, 20, 21. Binary counter IS 14 simultaneously controls the address of memory IS 17 (pins 8, 7, 6, 5). At the outputs of memory IS 17 the letters are generated in ASCII-Code which are decoded and shown by indicators IS 18, 19, 20, 21.

It was already mentioned that the counters IS 8, 9, 10 should issue a binary zero at their outputs for the lowest frequency in the wave range. In this case, the memory IS 15 must also show a zero at its outputs which is achieved by the program of memory IS 15.

If a binary zero is present at the outputs of memory IS 15, the 4-bit binary counter IS 14 triggers the first 16 addresses of memory IS 17 in sequence. With these 16 addresses the first station name is shown.

The following is valid for the case that a binary zero is at the outputs of memory IS 15:

If a zero is also at the outputs of binary counter IS 14, the first address of memory IS 17 is triggered. The output of the integrated circuit IS 16 (pin 9) and at a low level is triggered simultaneously since the outputs of counter IS 14 (pins 12, 11) are connected with the inputs of IS 16 (pins 13, 3). The low level signal at the output of the demultiplexer IS 16 (pin 9) turns on the indicator IS 21. The outputs of counter IS 14 (pins 14, 13) trigger the first address of the indicator IS 21, since the outputs of counter IS 14 (pins 14, 13) are connected with the address inputs of the indicators IS 21, 20, 19, 18 (pin 5 and pin 4).

With the next pulse a binary one will appear at the output of counter IS 14 (pin 14=high level). At this point the second address of memory IS 17 and the second position of indicator IS 21 are triggered. The output of the demultiplexer IS 16 (pin 9) remains unchanged, since the outputs of counter IS 14 (pin 12, 11) carry low level signal.

When the output of counter IS 14 shows a binary 2, the third address of memory IS 17 and the third position of indicator IS 21 are triggered. The output of the demultiplexer IS 16 (pin 9) further remains at a low level.

When a binary 3 appears at the output of the counter IS 14, the fourth address of memory IS 17 and the fourth position of indicator IS 21 are triggered. The output pin 9 of the demultiplexer IS 16 continues to remain at a low level.

When the output the counter IS 14 is set to a binary 4, the fifth address of memory IS 17 and the input of the demultiplexer IS 16 (pin 13) are triggered. At the output of the demultiplexer IS 16 (pin 10) the level is changed from high to low whereby the second indicator IS 20 is activated. The outputs of the counter IS 14 (pin 14, 13) were switched to a low level at this instant whereby the first position of the indicator IS 20 is triggered. Furthermore, the address of memory IS 17 is triggered in sequence to 15. After number 15, the counter IS 14 again counts from 0 to 15.

If a binary 2 is at the output of the memory IS 15, the counter now triggers the addresses from 32 through 47 in sequence. The third station name is stored at addresses 32 to 47 of memory IS 17. The program of the memory IS 17 is listed above.

It may be seen from the program of memory IS 15 that the addresses from 0 to 135 were occupied by the long-wave range. For the medium-wave or AM range, the addresses from 136 to 1226 are occupied.

For the short-wave range, the addresses from 1227 to 2048 are available.

The capacity of the memory IS 17 (4K-byte) suffices for 256 station names with 16 letters each. With a different choice for memory IS 17, greater storage capacities can be achieved if so desired.

The arrangement according to this invention facilitates the inputting and automatic indication of all station names with the abbreviation of the country in which the station is located as a function of the oscillator frequency of the receiver.

The solution is listed for a 16-digit 16-segment LED indicator. Advantageously, the indicator may also be constructed with four 5×7 grid LED indicators.

FIG. 2 shows an added circuit which facilitates inputting of other station names in addition to the station names retained in the EPROM memory IS 17 which can be shown on the indicator on an alternative basis. With this it is possible to determine other station names instead of stations which are indicated with a given set frequency instead of the originally scheduled frequency. This means that if a station becomes audible upon tuning which does not correspond with the station, the name or identification of which is indicated, it is possible to program a name into the system which is to appear instead of the undesired designation. The additional station name is retained in a read/write memory which can be switched on instead of the corresponding permanent memory.

The illustrated arrangement shown in FIG. 2 comprises the counter IS 14, the memory IS 15, the demultiplexer IS 16 and the memory IS 17. The external wiring corresponds with that shown in this figure with the address lines always being shown combined to one (greatly expanded) line. Also included is a RAM memory IS 22 (128×1 bit), a latch IS 23, as well as a 2K-byte RAM memory IS 24.

For every memory range for a station name in the memory IS 17, the memory IS 22 has a correlated memory bit which can be individually set or reset for every memory position addressed together with the memory IS 17 via memory IS 15 and on external switching device (arrow I). In this manner the memory positions of those stations can be "marked" where the chosen station name does not concur with the permanently inputted name. If a bit is "set" at a memory position, a signal is passed to the RAM memory IS 24 via the latch IS 23 which activates the memory IS 24, whereas EPROM memory IS 17 is maintained in an inactive state. In this case the lines leading to the indicator units IS 18 to IS 21 (which are also shown combined in FIG. 2) carry the signals triggering the indication of an alternative station name. If the corresponding bit is not set in the memory IS 22, the permanently stored name which is contained in the EPROM memory IS 17 will be indicated. The alternative station names are inputted into the RAM memory IS 24 by the user himself via a nonillustrated alphanumeric inputting means symbolized by arrow II when the memory is addressed by setting the corresponding station.

The arrangement shown in FIG. 2 consisting of constructing elements IS 22 through 24 can, in a corresponding manner, also be applied to the memory IS 15 instead of the EPROM memory IS 17. In the case of this configuration, not the station names directly but their correlation with indicated frequencies for individual stations are altered so that the alternative memory space in a RAM memory does not have to be changed for the entire station name but only for its address in the EPROM memory IS 17. This facilitates use of a smaller RAM memory IS 24. In the case of the last configuration a listing of all radio and/or television programs audible within a large area is maintained preferably in memory IS 17 wherein the accurate correlation for regional requirements is either implemented by complete exchange of memory IS 15 or by reprogramming of individual correlation addresses by way of a correspondingly wired RAM memory IS 22.

With a second version of the invention various correlations between set frequencies and indicated station names can be realized as a function of the local installation of the receiver. If the receiver, for instance, is to be operated at two different locations, memory IS 24 in FIG. 2 functions as a second EPROM memory in which the station names for a second location are stored. In a preferred version of this invention, multiples of those memory ranges are scheduled in this manner which are correlated with frequency ranges subjected to pronounced changes in case of a change in location, that is, particularly referring to the FM and TV areas. Instead of the latch IS 23, a converter must be used in these cases which can be operated manually and which corresponding with the receiver location either activates a memory IS 17 or IS 24 with the station names to be received at the respective frequencies as a function of its wiring status. This conversion may be implemented corresponding with a code correlated with the respective receiving area, such as Zip Codes.

With the last version of this invention mentioned above, it is also particularly advantageous if—depending upon the location of the receiver—changes are made in memory IS 15 which cause the addressing correlation instead of making alterations in the memory containing these station names.

In the last described functioning mode, the arrangement shown from memory IS 17 in FIG. 2 would be correlated with memory IS 15. Thus, memory IS 17 would contain the names of all radio programs to be received within an extended area whereas the correlation of the receiving station frequencies with the respective station names would then be carried out via convertible memory IS 15. In this manner it may be achieved that the memories which can be converted as a function of the regional location of the receiver can be designed as small as possible.

The invention can thus be realized in the most diverse versions which are adjusted to the respective purpose of application in the planned receiver type.

I claim:

1. A circuit arrangement for automatically indicating the alphanumeric station designation for a selected received frequency in one of the plurality of frequency ranges in a radio or TV receiver comprising:
    means for determining the frequency of the received frequency signal, the determining means generating a signal corresponding to the received frequency;
    first memory means having addressable memory locations storing pre-determined address information, the addressable memory locations being arranged in groups corresponding to one of the plurality of frequency ranges of the received frequency signals;
    counter means, responsive to the signal from the frequency determining means, for counting the received frequency, the counter means addressing the first memory means for outputting address information therefrom;
    means for pre-setting the counter means to 0 for the lowest received frequency in each range of received frequencies;
    second memory means having addressable memory locations storing pre-determined alphanumeric station designations;
    the output from the first memory means addressing the second memory means; and indicator means, responsive to the output information from the second memory means, for displaying the station designation of the received frequency signal.

2. The circuit of claim 1 wherein the means for pre-setting the counter means to 0 comprises a third memory means.

3. The circuit arrangement of claim 1 wherein the counter means converts the received frequency signal to a range of values which correspond with pre-determined ones of the address locations in the second memory means and to pre-determined ranges of the received frequency signals.

4. The circuit arrangement of claim 3 wherein:
the addresses in the first and second memory means covering a plurality of ranges of receiving frequency signals are substantially adjacent to each other.

5. The circuit arrangement of claim 1 wherein the counter means comprises at least one pre-setable counter.

6. The circuit arrangement of claim 1 wherein:
several adjacent address storage locations in the second memory means contain identical addresses so as to be concurrently addressed by the first memory means.

7. The circuit arrangement of claim 1 wherein the indicator means is an alphanumeric indicator.

8. The circuit arrangement of claim 1 further including:
further memory means addressable in parallel and alternately with first and second memory means, the further memory means containing addressable memory storage locations which can be read as an alternative to the addressable storage locations of the first and second memory means.

* * * * *